United States Patent [19]

Hara

[11] Patent Number: 6,119,265
[45] Date of Patent: Sep. 12, 2000

[54] VITERBI DECODING METHOD AND VITERBI DECODING APPARATUS CAPABLE OF INCREASING ERROR RATE

[75] Inventor: Masaaki Hara, Kanagawa, Japan

[73] Assignee: Sony Corporation, Tokyo, Japan

[21] Appl. No.: 08/926,584

[22] Filed: Sep. 4, 1997

[30] Foreign Application Priority Data

Sep. 5, 1996 [JP] Japan .................................. 8-235106

[51] Int. Cl.[7] .................................................. G06F 11/10
[52] U.S. Cl. ........................ 714/795; 714/778; 714/781; 714/792; 714/796; 375/254; 375/263; 375/265; 375/290
[58] Field of Search ................................. 371/43.7, 37.4, 371/43.4, 37.7, 43.8; 375/263, 265, 254, 290; 360/29, 32, 39, 40, 65; 369/59, 124

[56] References Cited

U.S. PATENT DOCUMENTS 5,291,499   3/1994   Behrens et al. ............................ 371/43

FOREIGN PATENT DOCUMENTS 0 695 042 A2   7/1994   European Pat. Off. .

*Primary Examiner*—William Grant
*Assistant Examiner*—McDieunel Marc

*Attorney, Agent, or Firm*—Frommer Lawrence & Haug, LLP.; William S. Frommer; Dennis M. Smid

[57] ABSTRACT

In a Viterbi decoding apparatus operable under 6-value/4-state, most likelihood decoding is carried out, so that a shift between a reproduction signal and a reference amplitude level can be avoided, and a better error rate can be obtained. The Viterbi decoding apparatus is constituted by reference amplitude level saving means for saving 6 values of reference amplitude levels determined by codes interference occurred by a combination of 1-bit recording data of interest, 1-bit recording data prior to the recording data of interest, and 1-bit recording data subsequent to the recording data of interest; branch metric calculating means for calculating a branch metric equal to a relative value of a Euclidean distance between an inputted reproduction signal and the reference amplitude level; path metric producing means for producing a path metric by adding the branch metrics along paths reached 4 states; most likelihood judgement control means for producing selection information used to select a minimum path metric from the path metrics and for updating the path metrics based on the selection information; and discrimination result output control means for outputting a discrimination result which constitutes a history of the path metric with respect to each of the four sates by receiving the selection information. As a result, most likelihood decoding is carried out by the Viterbi decoding apparatus under 4-value/6-state.

8 Claims, 15 Drawing Sheets

FIG. 4

| PRECEDING INPUT | | CONDITION | INPUT | SUBSEQUENT CONDITION | OUTPUT | $\lambda$ ($\mu=1$, $\nu=1-\lambda$) | | | | | |
|---|---|---|---|---|---|---|---|---|---|---|---|
| a[k-2] | a[k-1] | b[k-1] | a[k] | b[k] | c[k] | 1.0 | 0.9 | 0.8 | 0.7 | 0.6 | 0.5 |
| 0 | 0 | S00 | 0 | S00 | c000=0 | 0.0 | 0.0 | 0.0 | 0.0 | 0.0 | 0.0 |
| 0 | 0 | S00 | 1 | S01 | c001=$\nu$ | 0.0 | 0.1 | 0.2 | 0.3 | 0.4 | 0.5 |
| 0 | 1 | S01 | 0 | S10 | c010=$\mu$ | 1.0 | 1.0 | 1.0 | 1.0 | 1.0 | 1.0 |
| 0 | 1 | S01 | 1 | S11 | c011=$\mu+\nu$ | 1.0 | 1.1 | 1.2 | 1.3 | 1.4 | 1.5 |
| 1 | 0 | S10 | 0 | S00 | c100=$\lambda$ | 1.0 | 0.9 | 0.8 | 0.7 | 0.6 | 0.5 |
| 1 | 0 | S10 | 1 | S01 | c101=$\lambda+\nu$ | 1.0 | 1.0 | 1.0 | 1.0 | 1.0 | 1.0 |
| 1 | 1 | S11 | 0 | S10 | c110=$\lambda+\mu$ | 2.0 | 1.9 | 1.8 | 1.7 | 1.6 | 1.5 |
| 1 | 1 | S11 | 1 | S11 | c111=$\lambda+\mu+\nu$ | 2.0 | 2.0 | 2.0 | 2.0 | 2.0 | 2.0 |

VITERBI DECODING METHOD AND VITERBI DECODING APPARATUS CAPABLE OF INCREASING ERROR RATE

BACKGROUND OF THE INVENTION

The present invention generally relates to a Viterbi decoding method and a Viterbi decoding apparatus. More specifically, the present invention is directed to such Viterbi decoding method/apparatus operable under 6-value/4-state condition, capable of performing most likelihood decoding.

In digital data transmissions, signal processing operation by combining the partial response (PR) equalization with the Viterbi decoding is carried out. In the partial response equalization, codes interference is applied to waveforms to thereby perform effective transmissions. In the Viterbi decoding, the most certain data series is selected from the previously correlative data series to be reproduced.

For instance, in a magneto-optical disk and a phase-change disk, a modulation of RL min (minimum inverse width)=2 such as (1, 7) RLL (Run Length Limited)+NRZI (Non Return to Zero Inverted) is utilized. The 3-value/4-state conditioned Viterbi decoding in which PR (1, 1) is used as the equalization characteristic, or the 4-value/4-state conditioned Viterbi decoding in which PR (0.5, 1, 0.5) is used as the equalization characteristic is carried out. In the respective Viterbi decoding methods, the 0.5 T0 bits-shifted point is applied as the discrimination point.

However, in the actual recording/reproducing system, the above-described Viterbi decoding can be hardly made coincident with the desirable equalization characteristic. Also, since the S/N of the discrimination point becomes maximum having the intermediate characteristic of PR (1, 1) and PR (0.5, 1, 0.5) in response to the characteristic of the recording/reproducing system, it is not strictly equalized to any one of the equalization characteristics. As a consequence, the reproduction signal is deviated from the reference amplitude level of the Viterbi decoding due to the shifts from these equalization characteristics. Thus, there is a problem that the error rate is deteriorated.

Also, in the case that the Viterbi decoding is applied, the equalized reproduction signal must be A/D-converted in response to the PLL clock. However, for instance, in such a case that the recording rates are different from each other, depending upon the zones, as in the multi-zone CAV, it is practically difficult to precisely manage the phases of the PLL clocks. Therefore, this may cause that the reproduction signal is shifted from the reference amplitude level of the Viterbi decoding. Accordingly, there is another problem that the error rate is deteriorated.

Furthermore, in thermal recording operations, such a phenomenon will occur that a reproduction signal is made asymmetry with respect to an upper signal portion and a lower signal portion, because of excessive/short power of recording laser. This asymmetry cannot be compensated by a linear equalizer. Also, in any one of the Viterbi decoding operable under 3-value/4-state and 4-value/4-state, symmetry of a reproduction signal constitutes an initial condition. This phenomenon may also cause that the reproduction signal is shifted from the reference amplitude level of the Viterbi decoding. There is another problem that the error rate is deteriorated.

SUMMARY OF THE INVENTION

The present invention has been made to solve the above-described problems, and therefore, owns an object to provide a Viterbi decoding apparatus, and a Viterbi decoding method, capable of preventing a shift between a reproduction signal and a reference amplitude level, and also capable of achieving a better error rate.

To achieve the above-described object, a Viterbi decoding apparatus, according to an aspect of the present invention, is featured by comprising of: reference amplitude level saving device for saving 6 values of reference amplitude levels determined by codes interference occurred by a combination of 1-bit recording data of interest, 1-bit recording data prior to the recording data of interest, and 1-bit recording data subsequent to the recording data of interest; branch metric calculating device for calculating a branch metric equal to a relative value of a Euclidean distance between an inputted reproduction signal and the reference amplitude level; path metric producing device for producing a path metric by adding the branch metrics along paths reached 4 states; most likelihood judgement control device for producing selection information used to select a minimum path metric from the path metrics and for updating the path metrics based on the selection information; and discrimination result output control device for outputting a discrimination result which constitutes a history of the path metric with respect to each of the four sates by receiving the selection information, whereby most likelihood decoding is carried out by the Viterbi decoding apparatus under 6-value/4-state.

Further, to achieve the above-described object, a Viterbi decoding method, according to another aspect of the present invention, is featured by comprising: a reference amplitude level saving step for saving 6 values of reference amplitude levels determined by codes interference occurred by a combination of 1-bit recording data of interest, 1-bit recording data prior to the recording data of interest, and 1-bit recording data subsequent to the recording data of interest; a branch metric calculating step for calculating a branch metric equal to a relative value of a Euclidean distance between an inputted reproduction signal and the reference amplitude level; a path metric producing step for producing a path metric by adding the branch metrics along paths reached 4 states; a most-likelihood judgement control step for producing selection information used to select a minimum path metric from the path metrics and for updating the path metrics based on the selection information; and a discrimination result output control step for outputting a discrimination result which constitutes a history of the path metric with respect to each of the four sates by receiving the selection information, whereby most likelihood decoding is carried out by the Viterbi decoding method under 6-value/4-state.

In this case, the reference amplitude level saving device saves the reference amplitude levels constructed of six values determined by the codes interference. The branch metric calculating device calculates the branch metric equal to the relative value of the Euclidean distance between the inputted reproduction signal and this reference amplitude level. The path metric producing device produces the path metric by adding the branch metrics along the paths reached 4 state. The most likelihood judgement control device produces selection information used to select the minimum path metric from the path metrics, and also updates the path metrics based on this selection information. The discrimination result output control device outputs the discrimination result which constitutes the history of the path metric with respect to each of the four sates by receiving the selection information.

BRIEF DESCRIPTION OF THE DRAWINGS

For a better understanding of the present invention, reference is made of the detailed description to be read in conjunction with the accompanying drawings, in which:

FIG. 4 is a diagram for representing input/output and state transition under condition of $\mu=1$, and $\nu=1-\lambda$;

DETAILED DESCRIPTION OF THE PREFERRED EMBODIMENTS

Basic Idea of Viterbi Decoding Apparatus

Figure 1:
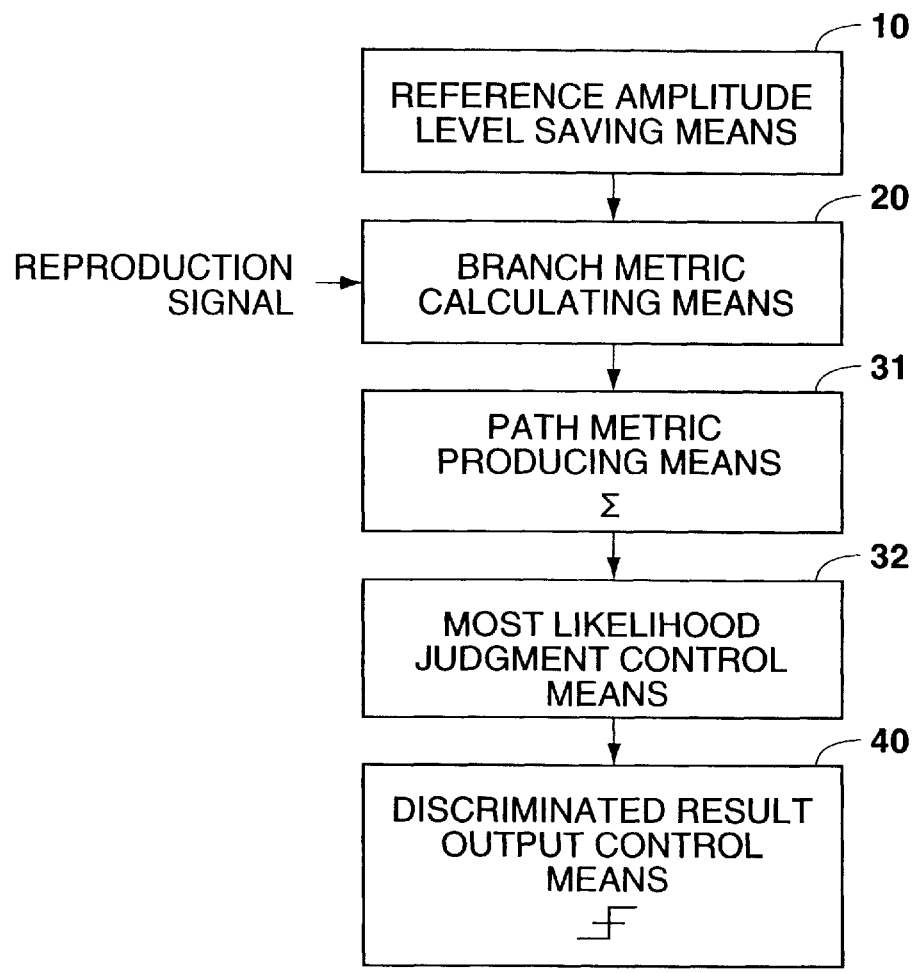
FIG. 1 schematically represents a basic idea of a Viterbi decoding apparatus according to the present invention.

Referring now to drawings, Viterbi decoding method/apparatus according to various embodiments of the present invention will be described. FIG. 1 schematically indicates a basic idea of a Viterbi decoding apparatus accomplished in accordance with the present invention. In FIG. 1, a reference amplitude level saving device 10 saves 6 values of reference amplitude levels determined by codes interference. A branch metric calculating device 20 calculates a branch metric corresponding to a relative value of a Euclidean distance between this reference amplitude level and an inputted reproduction signal. Then, a path metric producing means 31 adds the branch metrics along a path to thereby produce a path metric.

A most likelihood judgment control means 32 executes a most likelihood judgment. That is, since a path whose path metric is minimum is such that a relative value of a Euclidean distance between the reference amplitude level and the reproduction signal equal to the reception signal series is minimum, this most likelihood judgment control device 32 can judge most certainly that the transmission signal series corresponding thereto is transmitted. As a consequence, the most likelihood judgment control means 32 produces selection information for selecting a minimum path metric, and updates the path metric based on this selection information. A discrimination result output control device 40 outputs a discrimination result corresponding to a history of a path metric with respect to each of four states by receiving the selection information.

Next, a description will be made of a relationship between Viterbi decoding for 3-value/4-state, and Viterbi decoding for 4-value/4-state. In the case that such a modulation of RL min=2 is utilized, codes interference is allowable at a time instant t=0 and time instants $\pm T$ adjacent to the first-mentioned time instant. As a result, the codes interference up to 3 bits in maximum can be allowed.

Figure 2:
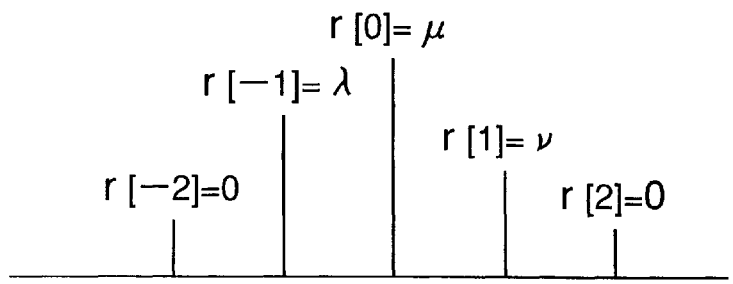
FIG. 2 illustrates a unit pulse response in a case that codes interference occurs in 1-bit recording data of interest, 1-bit recording data prior to this recording data of interest, and 1-bit recording data subsequent to this recording data of interest.

FIG. 2 schematically represents a unit pulse response in such a case that codes interference occurs in 1-bit recording data of interest, 1-bit recording data prior to this 1-bit recording data, and also 1-bit recording data of interest subsequent to this 1-bit recording data of interest. It should be noted that since the codes interference is allowable in a unit pulse response $\gamma[0]$ corresponding to a time instant t=0, and unit pulse responses $\gamma[-1]$ and $\gamma[1]$ corresponding to time instants $\pm T0$ adjacent to the time instant t=0, a unit pulse response for constituting PR ($\lambda, \mu, \nu$) may be an equalization characteristic.

A frequency characteristic of such a response may be expressed by the following formula (1). In this formula, symbol 1/T0 indicates a bit clock frequency.

$$h(\omega)=\lambda \cdot exp\ (-j\omega T0)+\mu+\nu \cdot exp\ (j\omega T0). \tag{1}$$

Now, since $\exp(j\omega T0)=\cos(\omega T0)+j\cdot\sin(\omega T0)$, the above formula (1) may be rearranged as follows:

$$h(\omega)=\mu+(\lambda+\nu)\cdot\cos\ (\omega T0\ )+j(\nu-\lambda)\cdot\sin\ (\omega T0). \tag{2}$$

Also, in order that a characteristic of a roll off=0 whose range is narrow is applied, since it should be $h(\omega)=0$ in the Nyquist frequency fn, when $\omega n=2\pi fn=\pi/T0$ is substituted for the above formula, the following formula (3) is given as follows:

$$h(\omega n)=\mu-(\lambda+\nu). \tag{3}$$

As a result, in order to realize it by a minimum bandwidth lower than, or equal to the Nyquist frequency, such a condition of "$\lambda+\nu=\mu$" may be satisfied. As is known in this field, as to PR (1, 1) where both maximum ends capable of satisfying "$\lambda+\nu=\mu$" become $\lambda=\mu=1$ and $\nu=0$, and PR (0.5, 1, 0.5) where both maximum ends become $\lambda=\nu=0.5$ and $\mu=1$, the Viterbi decoding of 3-value/4-state may be applied to the former PR, whereas the Viterbi decoding of 4-value/4-state may be applied to the later PR. These-two Viterbi decoding methods may be applied while points shifted by 0.5 T0 bits are used as discrimination points.

Figure 3:
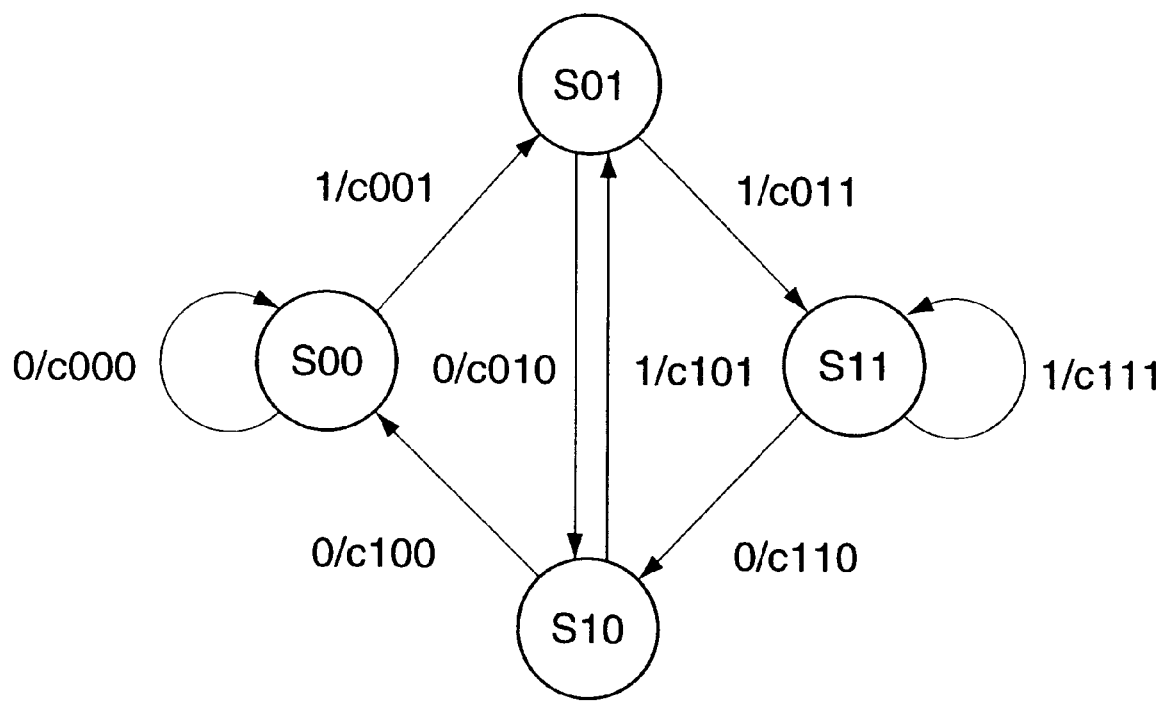
FIG. 3 shows a state transition diagram with respect to PR ($\lambda, \mu, \nu$)

FIG. 3 shows a state transition diagram with respect to PR ($\lambda, \mu, \nu$). In this state transition diagram, four states occupied by a state Sij (i, j∈0.1) are indicated by nodes, and transitions between states are represented by branches with arrows. Also, symbol a[k]/c[k] attached to a branch indicates that c[k] is outputted by an input a[k].

For instance, if the input is equal to 0 when the state is S00, then the output is equal to c000, and is not advanced to another state. If the input is equal to 1, then the output is c001 and is advanced to S01. Since this operation is similarly applied to other states, explanation thereof is omitted.

FIG. 4 represents inputs/outputs and state transitions under such a condition that $\mu=1$ and $\nu=1-\lambda$. A state b[k−1] is determined based on previous 2-bit inputs a[k−2] and a[k−1], and an output c[k] and a next state b[k] are determined based on a next input a[k]. FIG. 4 also indicates numeral values of an output c[k] with respect to "$\lambda$" being 0.5 to 1.0.

For instance, in such a case that a [k−2] and a [k−1] as preceding inputs are 0.0, and also the input a[k] is equal to 1 when the state b[k−1] is S00, the next state b[k] becomes S01. Also, the output c[k] becomes c001=$\nu$, and numeral values available for "$\nu$" are selected to be 0.0 to 0.5 from the value of $\lambda$. Since this may be similarly applied to other cases, explanations thereof are omitted.

Next, the Viterbi coding of 6-value/4-state will now be summarized. Generalized Viterbi coding with respect to a modulation code where RL min=2 becomes 6-values/4-states.

Figure 5:
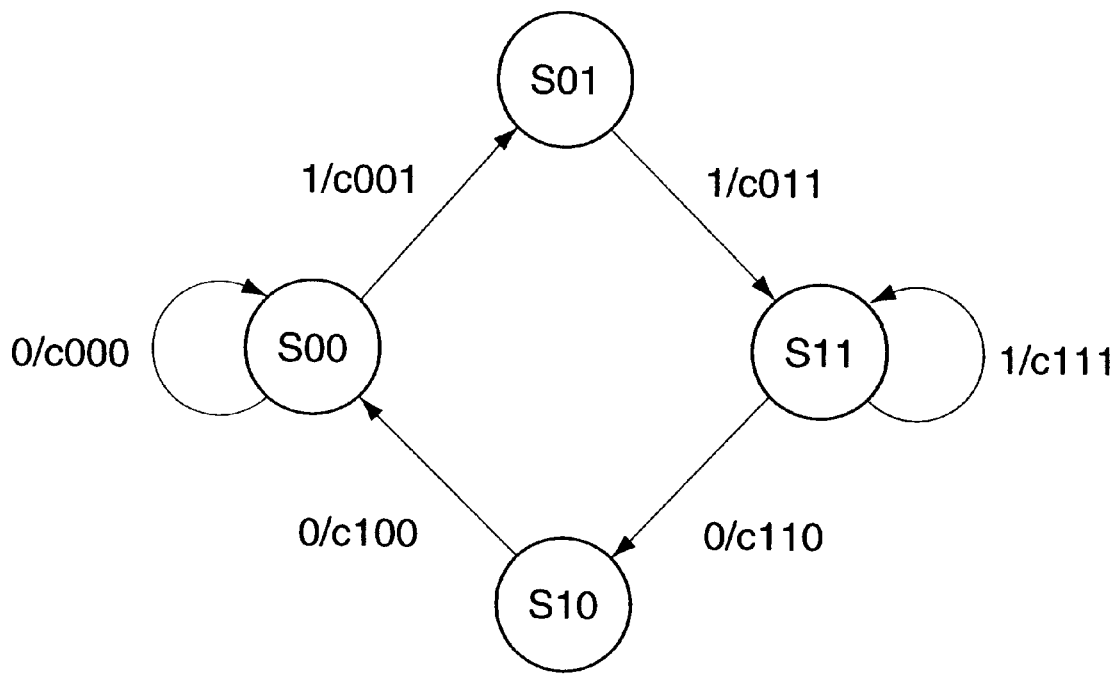
FIG. 5 is a state transition diagram for showing 6-value/4-state of Viterbi decoding.

FIG. 5 is a state transition diagram of the Viterbi coding of 6-values/4-states. If such a modulation code that RL min=2 is employed, then there is no isolated inversion. Accordingly, since there are no c101 and c010, the state transition diagram as shown in this drawing is obtained. Since the state transition has been explained with respect to FIG. 3, explanations thereof are omitted.

Figure 6:
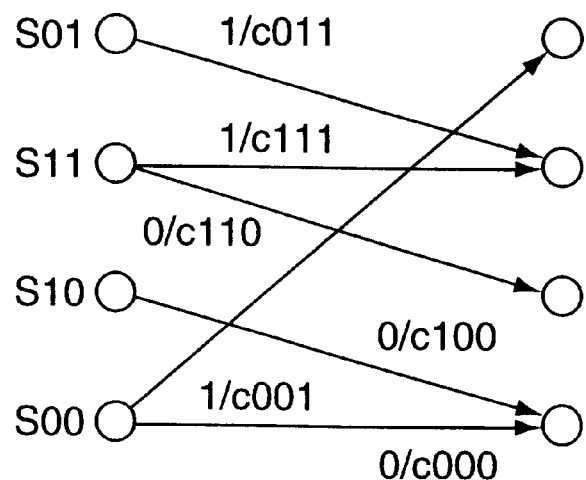
FIG. 6 is a trellis diagram for indicating 6-value/4-state of Viterbi decoding.

FIG. 6 is a trellis diagram. The state transition of FIG. 5 is represented with respect to a time axis. For instance, if the input is 1 under state S01, then the output is c011, and is advanced to a state S11. Also, if the input is 1 under state S11, then the output is c111, and a transition state is the same S11. Since other states are similar to the above state, explanations thereof are omitted.

Now, as to the Viterbi decoding of 6-value/4-state, a path metric is defined as in the following formula with respect to each of the four states;

$$L01(k) = L11(k-1) + (z(k) - c011)^2 \quad (4)$$

$$L11(k) = \min\{L11(k-1) + (z(k) - c111)^2, L10(k-1) + (z(k) - c110)^2\}$$

$$L10(k) = L00(k-1) + (z(k) - c100)^2$$

$$L00(k) = \min\{L00(k-1) + (z(k) - c000)^2, L01(k-1) + (z(k) - c001)^2\}.$$

In the above formula (4), a squared value of a difference between the received reproduction signal z[k] and the reference amplitude level c*** is referred to as a branch metric between transition states. Also, a summation of branch metrics along paths reached the respective states is referred to as a path metric, and is expressed by Lij (i, j∈o, 1). Then, the formula (4) in which a branch metric is added to a path metric Lij (k−1) of a state Sij at one preceding time instant "k−1" indicates a path metric of the state Sij at a time instant "k". It should be understood that since it is sufficient to judge the most likelihood of the state transition by employing only relatively large/small values of the path metric, the square calculation is omitted. Then, the above-described formula (4) is again defined while using mij[k]=Lij[k]−(z[k])². A selection is made of the minimum path metric from the path metrics of all paths reached the state Sij at the time instant "k". These descriptions are expressed by the following formula:

$$m01(k) = m11(k-1) + (c011 - 2 \cdot z(k)) \cdot c011 \quad (5)$$

$$m11(k) = \min\{m11(k-1) + (c111 - 2 \cdot z(k)) \cdot c111, m10(k-1) + (c110 - 2 \cdot z(k)) \cdot c110\}$$

$$m10(k) = m00(k-1) + (c100 - 2 \cdot z(k)) \cdot c100$$

$$m00(k) = \min\{m00(k-1) + (c000 - 2 \cdot z(k)) \cdot c000, m01(k-1) + (c001 - 2 \cdot z(k)) \cdot c001\}.$$

Figure 7:
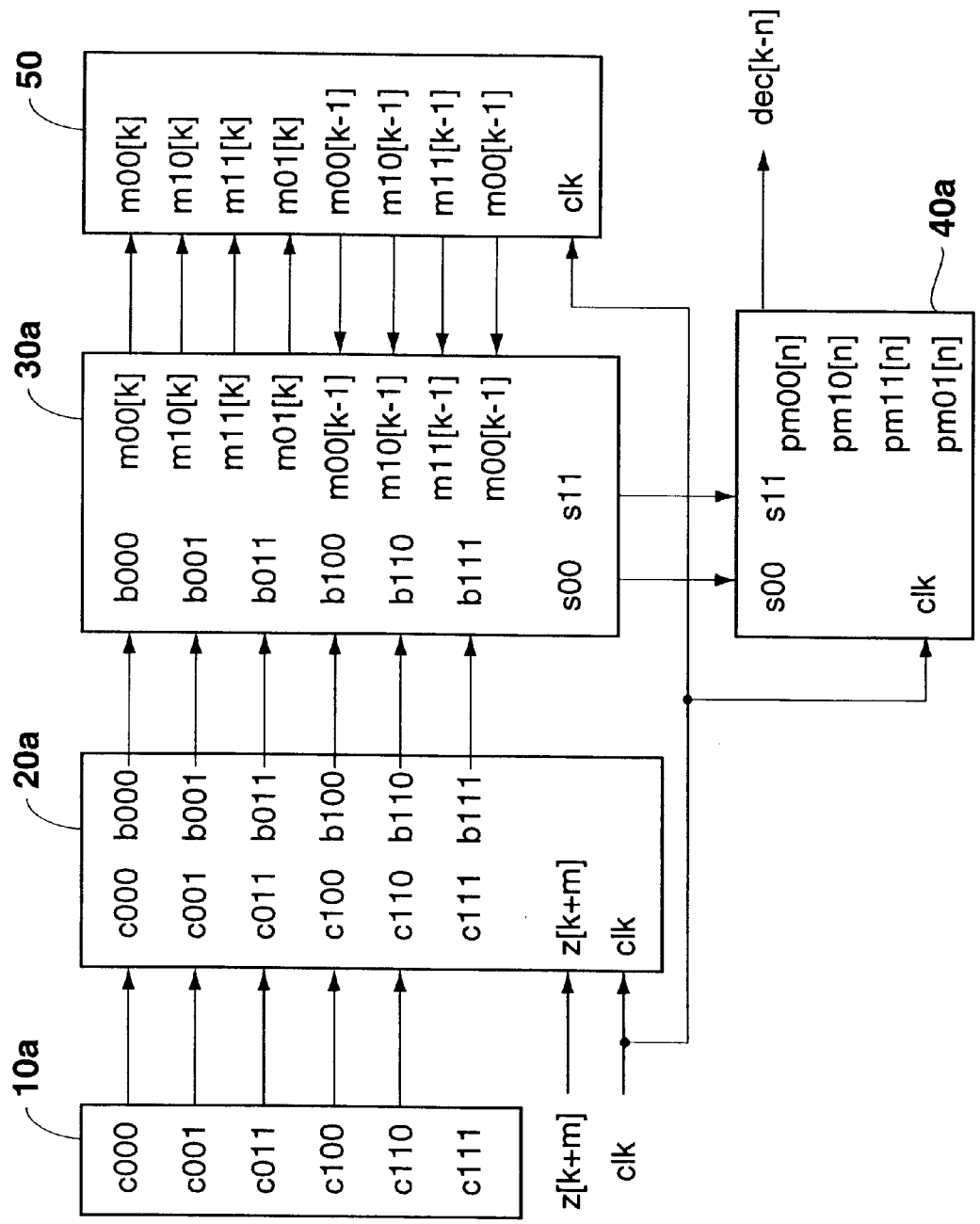
FIG. 7 is a schematic circuit block diagram of a Viterbi decoding apparatus according to a first embodiment of the present invention.

Then, a Viterbi decoding apparatus according to a first embodiment mode of the present invention will now be described in detail. FIG. 7 is a schematic block diagram for showing a circuit arrangement of the Viterbi decoding apparatus of the first embodiment. The Viterbi decoding apparatus is constituted by a reference amplitude level saving circuit 10a corresponding to the reference amplitude level saving means 10; a branch metric calculating circuit (BMC: Branch Metric Calculator) 20a corresponding to the branch metric calculating means 20; an adding/comparing/selecting circuit (ACS: Add Compare & Select) 30a corresponding to the path metric producing device 31 and the most likelihood judgment control device 32; a path memory circuit (PMU: Path Memory Unit) 40a corresponding to the discrimination result output control device 40; and a path metric memory circuit (MMU: Metric Memory Unit) 50.

The branch metric calculating circuit 20a calculates a relative value of a Euclidean distance between a reproduction signal z[k] and a reference amplitude level to thereby obtain a branch metric. This calculation of the branch metric may be carried out over m clocks. Assuming now that the branch metrics of the Viterbi decoding of 6-value/4-state are selected to be b000 to b111, the below-mentioned formula (6) is obtained. The reference amplitude levels c000 to c111 are given from the reference amplitude level saving circuit 10a.

$$b000 = (c000 - 2 \cdot Z(k+m)) \cdot c000 \quad (6)$$

$$b001 = (c001 - 2 \cdot Z(k+m)) \cdot c001$$

$$b011 = (c011 - 2 \cdot Z(k+m)) \cdot c011$$

$$b100 = (c100 - 2 \cdot Z(k+m)) \cdot c100$$

$$b110 = (c110 - 2 \cdot Z(k+m)) \cdot c110$$

$$b111 = (c111 - 2 \cdot Z(k+m)) \cdot c111.$$

The adding/comparing/selecting circuit 30a adds the branch metrics along the paths reached the four states to thereby produce path metrics m00[k] to m11[k]. Then, these path metrics m00[k] to m11[k] are transmitted to the path metric memory circuit 50.

The path metric memory circuit 50 corresponds to such a process circuit that the path metrics do not overflow. That is, the path metric memory circuit 50 once latches the path metrics m00[k] to m11[k], and then transmits the latched path metrics m00[k−1] to m11[k−1] to the adding/comparing/selecting circuit 30a.

The adding/comparing/selecting circuit 30a produces selection information S00 and S11 based on a comparison condition as expressed by the below-mentioned formula, and the selection information S00 and S11 is used to select a minimum path metric from the path metrics m00[k−1] to m11[k−1] and the branch metrics b000 to b111.

$$s00 = (m00(k-1) + b000 < m01(k-1) + b001) \quad (7)$$

$$s11 = (m11(k-1) + b111 < m10(k-1) + b110).$$

It should be noted that if the relationship of m00[k−1]+b000<m01[k−1]+b001 is true, then the selection information S00 of the formula (7) is equal to 1. Similarly, if the relationship of m11[k−1]+b111<m10[k−1]+b110 is true, then the selection information S11 is equal to 1.

Also, the path metric is updated by the adding/comparing/selecting circuit 30a and the path metric memory circuit 50 in accordance with the following formula (8):

$$m00(k) = s00 \cdot (m00(k-1) + b000) + \quad (8)$$
$$!s00 \cdot (m01(k-1) + b001)$$
$$m01(k) = m11(k-1) + b011$$
$$m10(k) = m00(k-1) + b100$$
$$m11(k) = s11 \cdot (m11(k-1) + b111) +$$
$$!s11 \cdot (m10(k-1) + b110).$$

The path metric memory circuit 40a receives the selection information S00 and S11, and stores a description result constituting a history of a path metric with respect to each of the f our states, and sequentially updates the description results to thereby output the updated description results. The path metric memory circuit 40a is arranged by "n" stages of shift registers with respect to each of the four states. Assuming now that the description results of the respective states acquired before i bits are pm00[i] to pm11[i] (i=1 to n), the following formula is given:

$$pm01(0) = 0; pm01(i) = pm11(i-1) \quad (9)$$
$$pm11(0) = 1; pm11(i) = pm11(i-1) \cdot$$
$$s11 + pm10(i-1) \cdot !s11$$
$$pm10(0) = 1; pm10(i) = pm00(i-1)$$
$$pm00(0) = 0; pm00(i) = pm00(i-1) \cdot$$
$$s00 + pm00(i-1) \cdot !s00.$$

In this case, as to the state S00 and the state S11, either a parallel load or a serial shift is carried out in response to the selection information S00 and S11. As to the state S01 and the state S10, a parallel load is continuously performed. If the stage number "n" of the shift register is sufficiently large, since pm01[n]=pm11[n]=pm10[n]=pm00[n], for example, pm00[n] is outputted as a discrimination result dec[k−n].

Second Viterbi Decoding Apparatus

Figure 8:
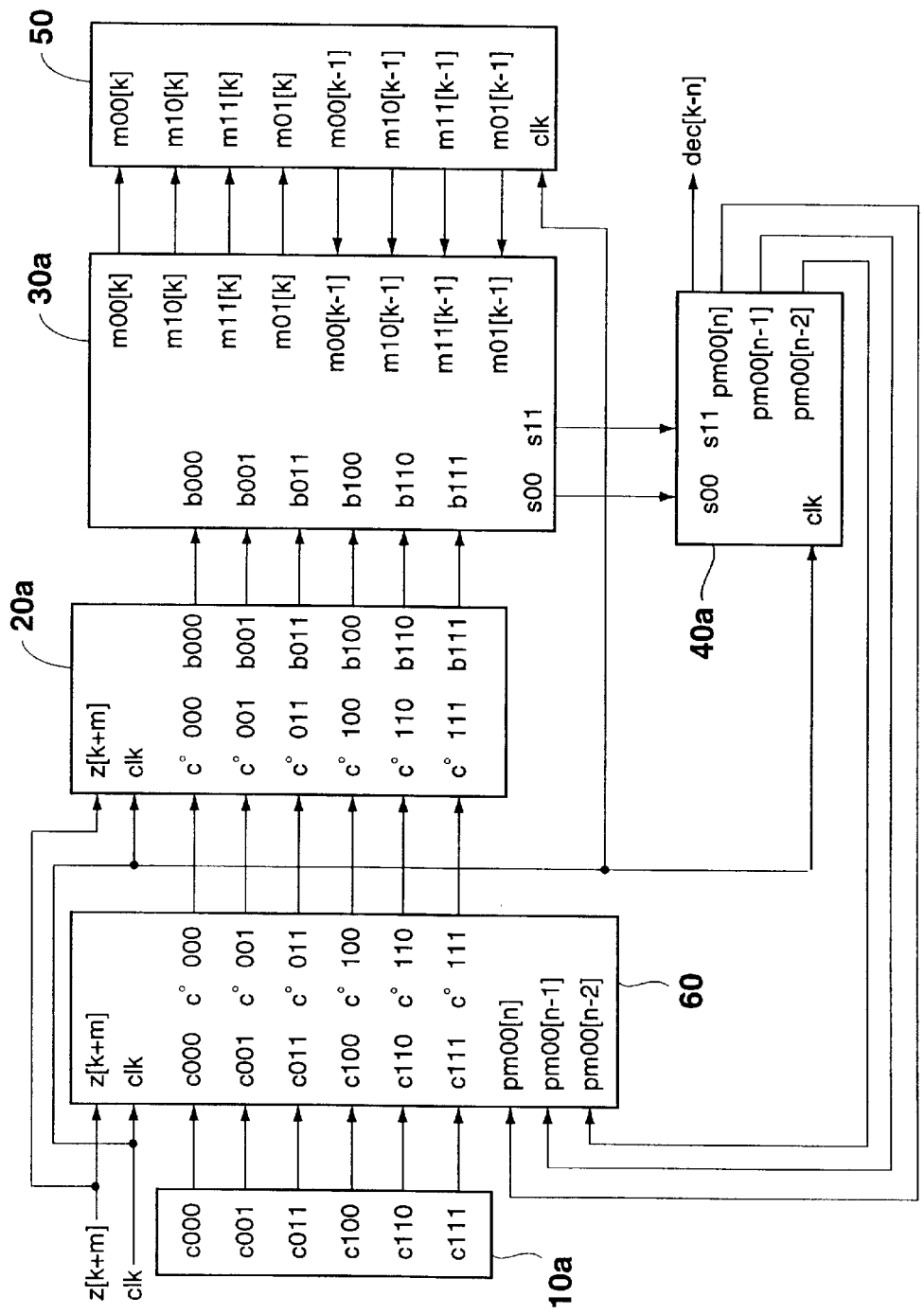
FIG. 8 is a schematic circuit block diagram of a Viterbi decoding apparatus according to a second embodiment of the present invention.

Subsequently, a Viterbi decoding apparatus according to a second embodiment of the present invention will now be described. In accordance with the second embodiment mode, a reference amplitude level updating means for adaptively controlling a reference amplitude level is additionally provided. FIG. 8 represents a circuit arrangement of a Viterbi decoding apparatus according to the second embodiment. A reference amplitude level updating circuit 60 corresponding to the reference amplitude level updating means is added in addition to the respective circuits as explained in FIG. 7. In the Viterbi decoding apparatus of the second embodiment, the reference amplitude level is merely updated by the reference amplitude level updating circuit 60, and then the updated reference amplitude level is merely transmitted to the branch metric calculating circuit 20a, as explained in FIG. 7. Accordingly, explanations of the overall arrangement of this second Viterbi decoding apparatus are omitted.

The reference amplitude level updating circuit 60 sequentially varies the reference amplitude level in combination with the reference amplitude levels c000 to c111 and the discrimination results. For example, in the case that pm00[n]=0, pm00[n−1]=1, and pm00[n−2]=1, since this is equal to the combination of the discrimination result with respect to the input z[k−n+2], the reference amplitude level c011 is updated by way of the following formula (10) to become C°011;

$$c°011 \rightarrow \alpha \cdot z[k-n+2] + (1-\alpha) \cdot c011. \quad (10)$$

Thereafter, the updated reference amplitude level is entered into the next branch metric calculating circuit 20a so as to be used to calculate the branch metric. In this formula, symbol "α" indicates a correction coefficient.

Also, the reference amplitude level updating circuit 60 is constituted by (m+n−2) stages of shift registers for delaying the input z[k+m] until the discrimination result is defined, and a selective adder operable in accordance with the below-mentioned formulae:

$$u000 = !pm00(n) \cdot !pm00(n-1) \cdot !pm00(n-2) \quad (11)$$
$$u001 = !pm00(n) \cdot !pm00(n-1) \cdot pm00(n-2)$$
$$u011 = !pm00(n) \cdot pm00(n-1) \cdot pm00(n-2)$$
$$u100 = pm00(n) \cdot !pm00(n-1) \cdot !pm00(n-2)$$
$$u110 = pm00(n) \cdot pm00(n-1) \cdot !pm00(n-2)$$
$$u111 = pm00(n) \cdot pm00(n-1) \cdot pm00(n-2).$$

$$c000 = a \cdot (u000 \cdot z(k-n+2) + \quad (12)$$
$$!u000 \cdot c000) + (1-a) \cdot c000)$$
$$c001 = a \cdot (u001 \cdot z(k-n+2) +$$
$$!u001 \cdot c001) + (1-a) \cdot c001$$
$$c011 = a \cdot (u011 \cdot z(k-n+2) +$$
$$!u011 \cdot c011) + (1-a) \cdot c011)$$
$$c100 = a \cdot (u100 \cdot z(k-n+2) +$$
$$!u100 \cdot c100) + (1-a) \cdot c100)$$
$$c110 = a \cdot (u110 \cdot z(k-n+2) +$$
$$!u110 \cdot c110) + (1-a) \cdot c110)$$
$$c111 = a \cdot (u111 \cdot z(k-n+2) +$$
$$!u111 \cdot c111) + (1-a) \cdot c111).$$

It should be noted that if PR (0.5, 1, 0.5) is the equalization characteristic, then the reference amplitude levels of the Viterbi decoding of 4-value/4-state are inputted as the initial value. Also, if PR (1, 1) is the equalization characteristic, then the reference amplitude levels of the Viterbi decoding of 3-value/4-state are inputted as the initial values.

Next, a description will now be made of a simulation result with respect to a phase shift of a discrimination point of the Viterbi decoding apparatus. First, a reference amplitude level when the phase of the discrimination point is varied in a range from −2T0 to +2T0 is calculated. Based on this reference amplitude level, an error rate simulation is carried out when the Viterbi decoding operation is performed. As an optical parameter in order to obtain MTF (Modulation Transfer Function) used in the simulation, numeral values contained in a table 1 were used which correspond to the maximum density of 0.38 μm in the experimental MD disk drive.

TABLE 1

| Bit rate | 39 Mbps |
|---|---|
| Reproducing radius | 50 mm |
| Rotation speed | 1,920 rpm |
| Numerical aperture of lens | 0.55 |
| Wavelength of laser | 680 nm |

Figure 9:
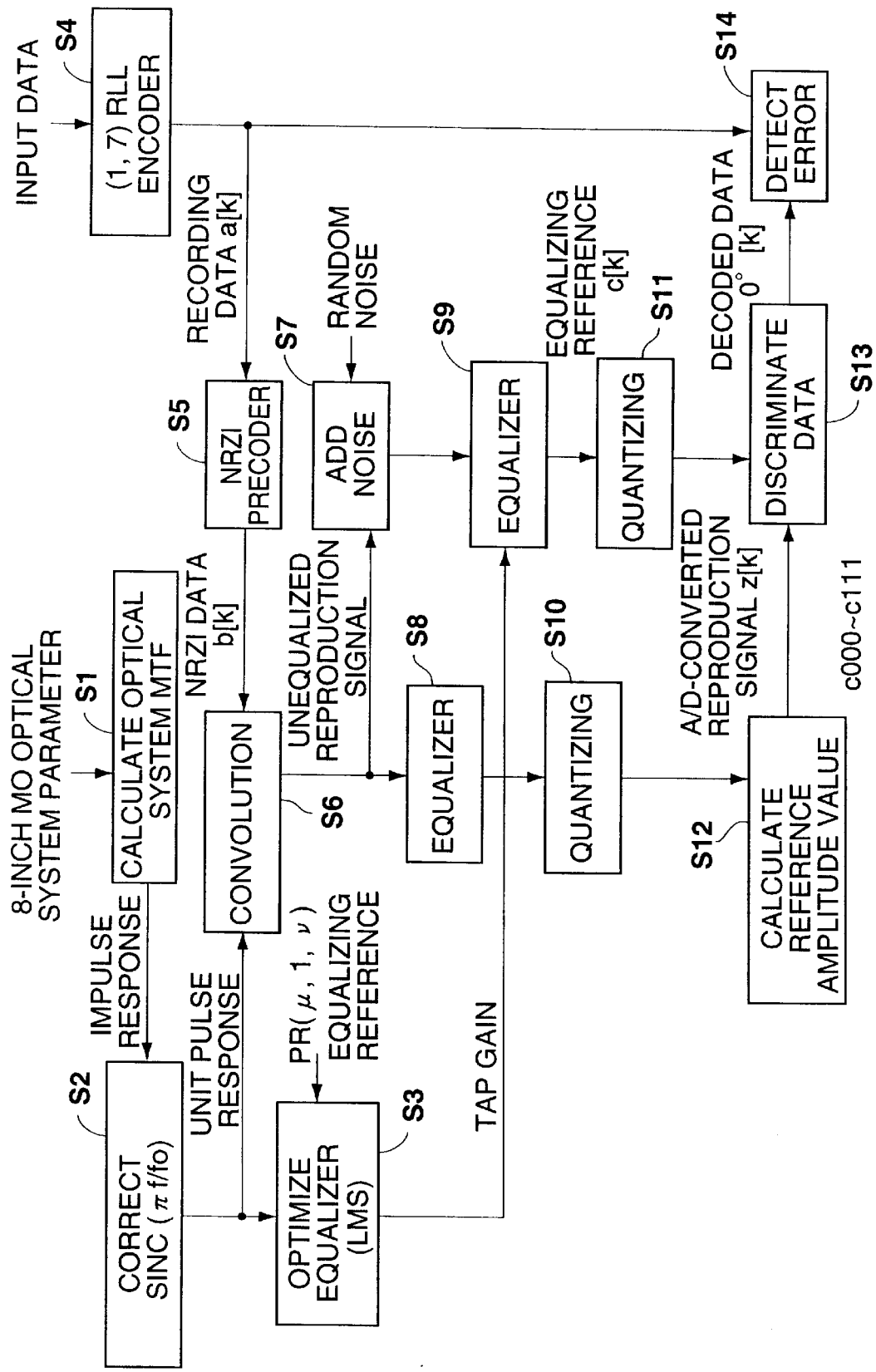
FIG. 9 illustratively indicates an error rate simulation process operation.

FIG. 9 illustrates a process sequence of an error simulation.

[S1] An impulse response of an optical system is calculated as an optical system MTF (Modulation Transfer Function) based upon an optical parameter.

[S2] An sinc (πf/f0) correction is carried out in accordance with the actual data rate f0, and a unit pulse response is obtained from the impulse response.

[S3] While applying the PR ($\mu$, 1, v) equalization reference, a tap gain used to set the unit pulse response to the characteristic of PR ($\mu$, 1, v) by the LMS (Least Mean Square) algorithm is obtained.

[S4] The input data is (1, 7) RLL-modulated to obtain recording data a[k].

[S5] NRZI is precoded to the recording data a [k] so as to obtain NRZI data b[k].

[S6] Both the NRZI data b[k] and the unit pulse response are convoluted to obtain a reproduction signal before being equalized, i.e., unequalized reproduction signal.

[S7] Random noise is added to the unequalized reproduction signal.

[S8] The unequalized reproduction signal to which the random noise has not yet been added is waveform-equalized by an equalizer, so that the equalized reproduction signal is obtained.

[S9] The unequalized reproduction signal to which the random noise is added is waveform-equalized, so that the equalized reproduction signal is obtained.

[S10] The equalized reproduction signal to which the random noise has not yet been added is quantized by 6 bits, so that reproduction signals A/D-converted by 0 to 63 are obtained.

[S11] The equalized reproduction signal to which the random noise is added is quantized by 6 bits, so that reproduction signals A/D-converted by 0 to 63 are obtained.

[S12] A calculation is made of the reference amplitude levels c000 to c111 from the quantized reproduction signal to which the random noise has not yet been added.

[S13] Decoded data ao[k] is obtained from the quantized reproduction signal z[k] to which the random noise has been added based on the reference amplitude levels c000 to c111.

[S14] The decoded data ao[k] is compared with the (1, 7) RLL-converted recording data a[k] to thereby detect an error.

In the above-described error rate simulation, six sorts of reference amplitude levels c000 to c111 are calculated from the noise-free reproduction signal equalized by the equalizer. Since there is no characteristic variation in the simulation by employing MTF, while the reference amplitude level is not adaptively varied, but the average value of the amplitudes is previously calculated by combinating the 3-bit recording data, this average value is used as the six sorts of reference amplitude levels. Also, after the equalization and the noise addition have been carried out by way of the floating-point arithmeticm, the reproduction signal is converted into integers of dynamic ranges 0 to 63, which will then be calculated by the Viterbi decoding, supposing the 6-bit A/D-converter.

Figure 10:
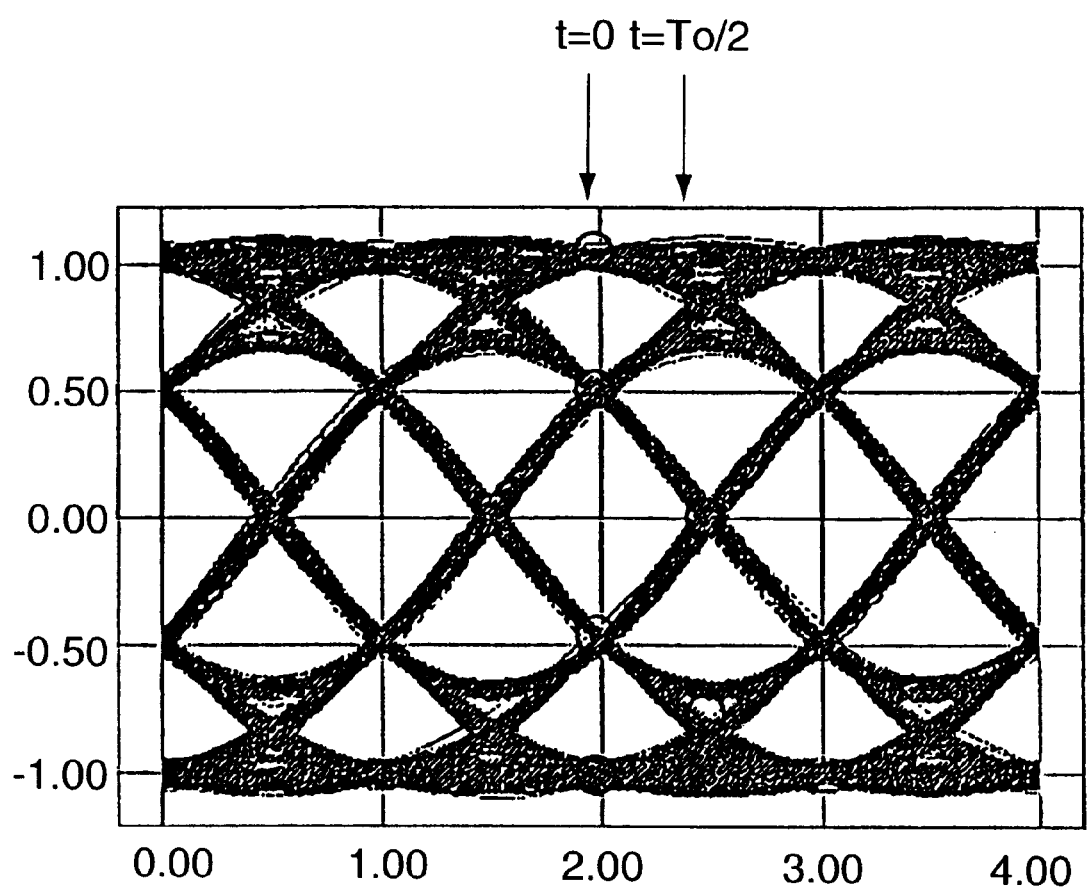
FIG. 10 graphically shows an eye pattern in the case that PR (0.5, 1, 0.5) is used as the equalization characteristic.

Next, a description will now be made of a relationship between the discrimination-point phase and the reference amplitude level, and another relationship between the discrimination-point phase and the bit error rate. FIG. 10 represents an eye pattern in a case that PR (0.5, 1, 0.5) is used as the equalization characteristic. An abscissa of FIG. 10 indicates time, and an ordinate of FIG. 10 denotes an amplitude. As can be judged from the eye pattern, when there is no codes interference, opening of the eye is increased and discrimination margin is also increased. Conversely, when there is codes interference, opening of the eye is decreased and discrimination margin is also decreased.

Figure 11:
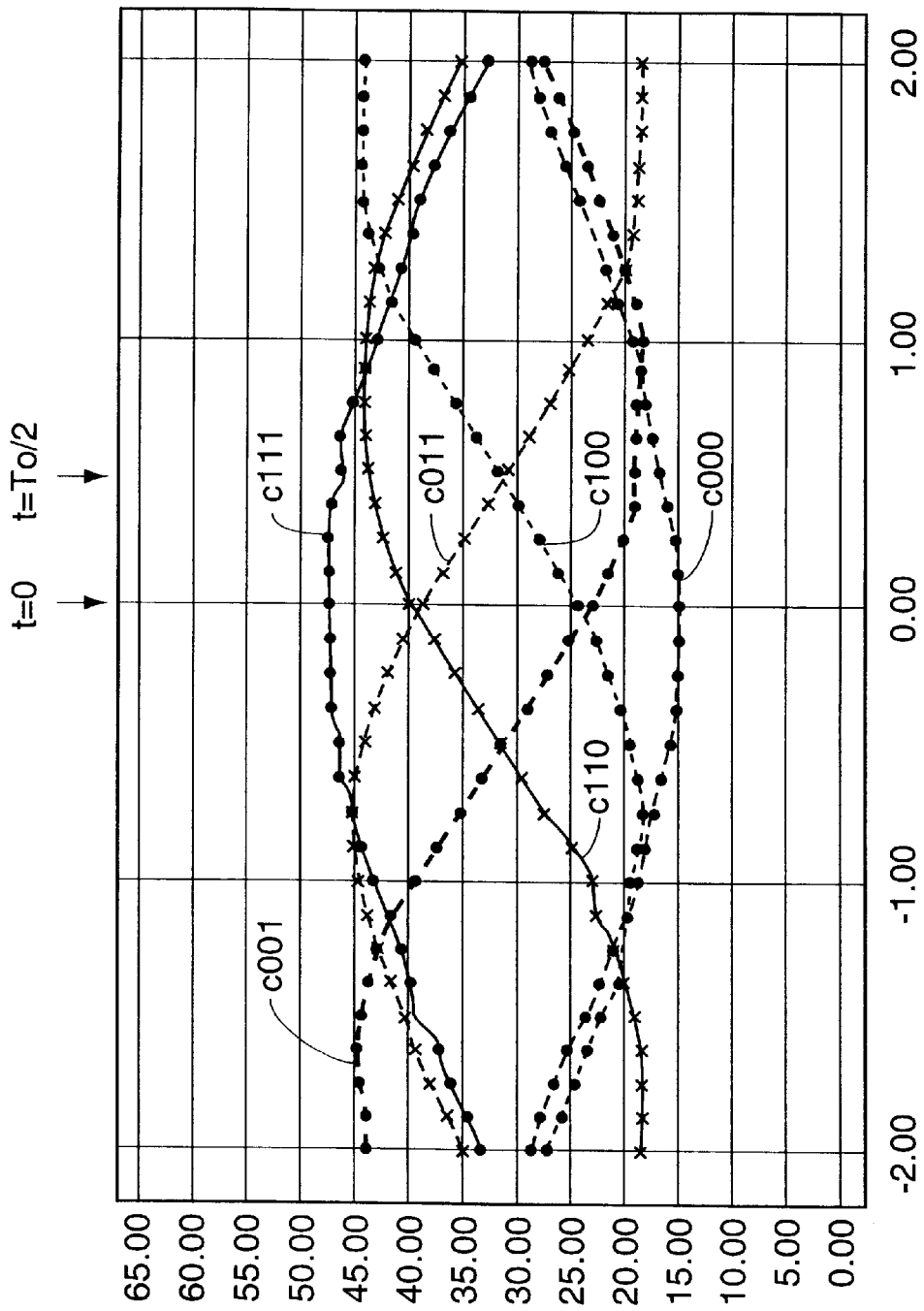
FIG. 11 graphically indicates a reference amplitude level in the case that a discrimination-point phase is varied in a range of $-2T0$ to $+2T0$.

FIG. 11 graphically shows reference amplitude levels in such a case that a discrimination point phase is varied in a range from −2T0 to +2T0. As abscissa of FIG. 11 shows the discrimination point phase, and an ordinate of FIG. 11 denotes the reference amplitude level. The reference amplitude levels of the Viterbi decoding of 3-value/4-state employed in the comparison are given as c000=c001=16, c100=c011=32, and c110=c111=48 under t=T0/2. The reference amplitude levels of the Viterbi decoding of 4-value/4-state are given as c000=16, c001=c100=24, c011=c110=40, and c111=48 under t=0.

In this case, since the equalization characteristic is PR (0.5, 1, 0.5), the discrimination-point phase is substantially coincident with the reference amplitude values of the Viterbi decoding of 4-value/4-state under t=0. However, under t=T0/2, the discrimination-point phase is slightly shifted from the reference amplitude values of the Viterbi decoding of 3-value/4-state.

Figure 12:
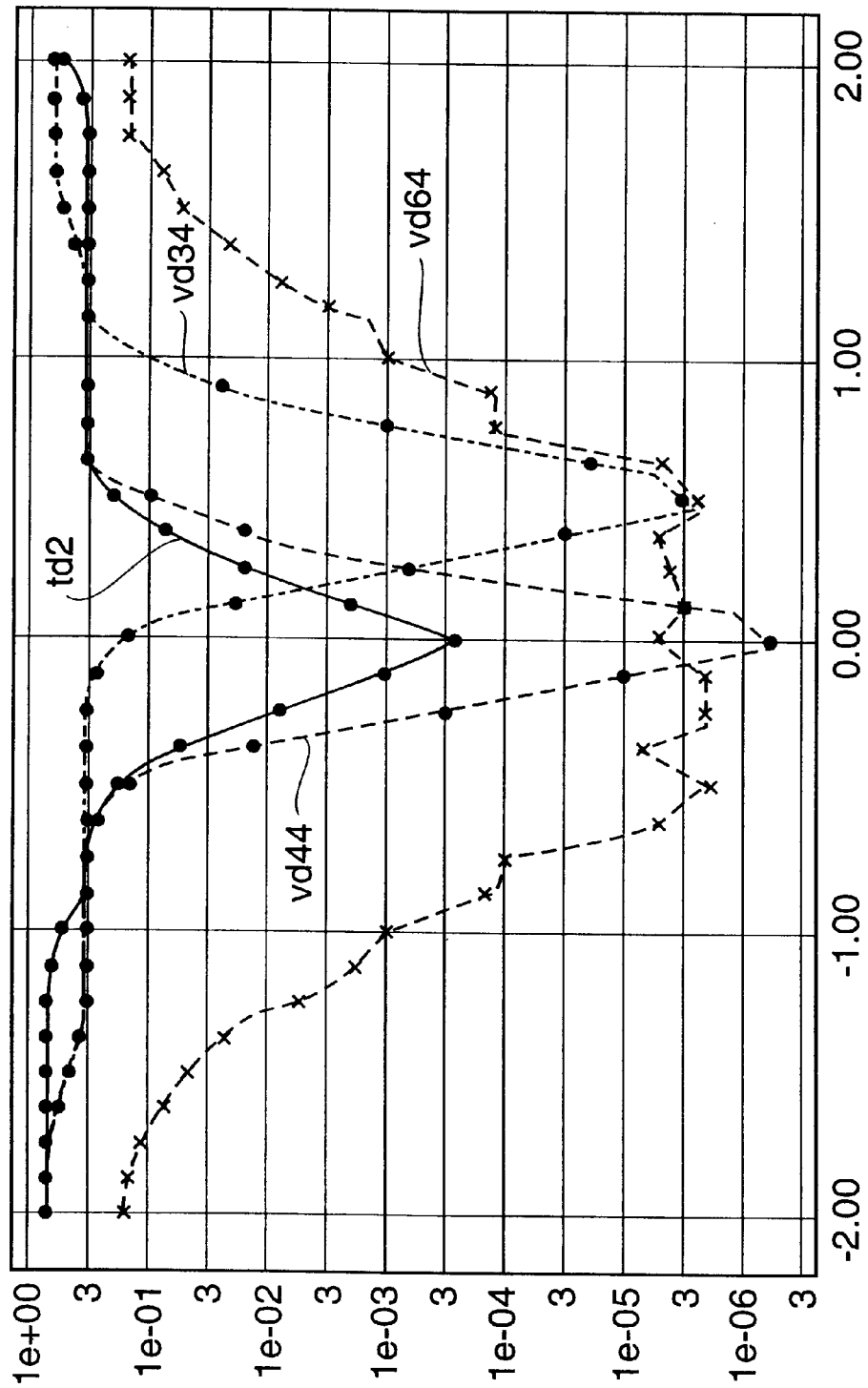
FIG. 12 represents a relationship between the discrimination-point phase and the error rate.

FIG. 12 graphically represents a relationship between a discrimination-point phase and a bit error rate. An abscissa of FIG. 12 indicates the discrimination-point phase, and an ordinate of FIG. 12 denotes the value of the reference amplitude level. This graphic representation shows such a comparison result that a relationship between discrimination-point phases of 6-value/4-state Viterbi decoding (vd64) and a bit error rate (BER) is compared with 2-value threshold value discrimination (td2), 3-value/4-state Viterbi decoding (vd34), and 4-value/4-state Viterbi decoding (vd44).

In the case that the amplitude of the unit pulse response is selected to "S", random noise is added in order to achieve S/N=20 dB. As apparent from this graphic representation, although no practical operation can be performed under td2, if the Viterbi decoding is utilized, then the practically available S/N can be achieved.

Assuming now that if the bit error rate is smaller than, or equal to 1E-04, then error correction can be done, when a range of allowable discrimination-point phases is investigated, the following table 2 is given as follows:

TABLE 2

| | Range of 1E–04 |
|---|---|
| td2 | — |
| vd34 | +0.375T0 to +0.625T0 |

TABLE 2-continued

| | Range of 1E–04 |
|---|---|
| vd44 | −0.125T0 to +0.125T0 |
| vd64 | −0.750T0 to +0.625T0 |

As apparent from the table 2, in accordance with the Viterbi decoding apparatus of the present invention, the discrimination-point phase may be shifted in the range of ±0.6T0. Actually, the shift in the discrimination-point phase does not exceed ±0.5T0. As a consequence, there is no problem that the discrimination-point phase may be located in any place.

Figure 13A:
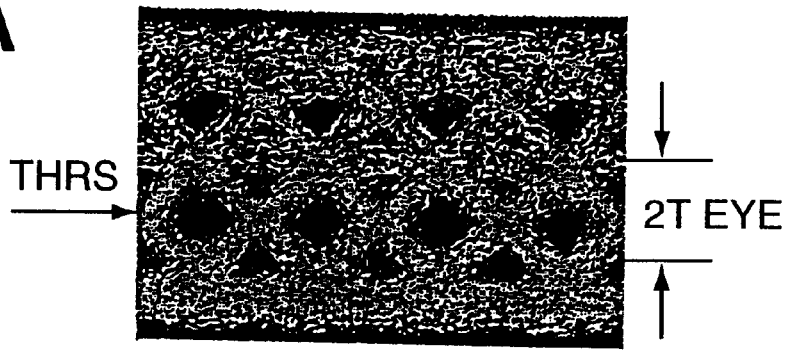
FIGS. 13A through 13C are diagrams for representing measurement examples in magneto-optical recording by light modulation in the case that recording laser power is varied.
Figure 13B:
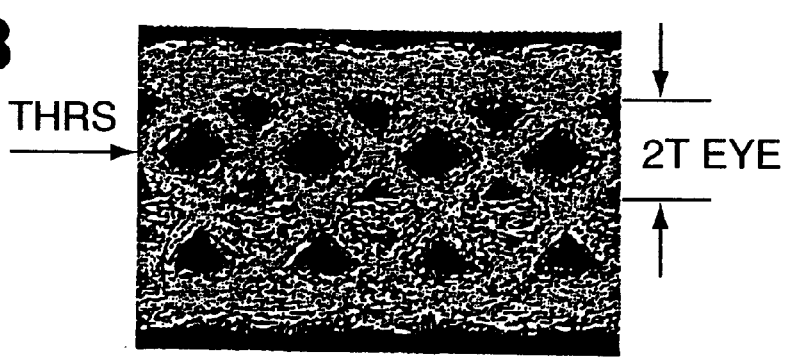
Figure 13C:
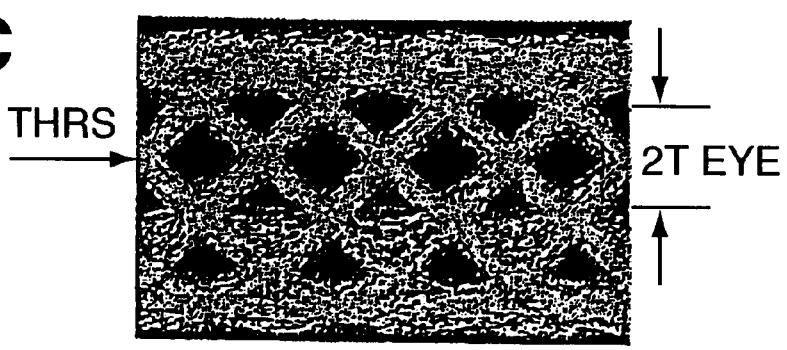

Next, a nonlinear distortion in asymmetry will now be explained. The asymmetry appearing in a phase-change disk and a magneto-optical disk is caused by excessive/short power of recording laser with respect to media. FIG. 13 represents measurement examples in such a case that while the recording laser power is varied, the magneto-optical recording operation by the light modulation is carried out. Concretely speaking, FIG. 13A shows an eye pattern produced when the setting value of the recording laser power is minimum. FIG. 13B indicates an eye pattern produced when the setting value of the recording laser power is maximum. FIG. 13C represents an eye pattern produced when the setting value of the recording laser power is substantially equal to the intermediate value. Symbol THRS indicates a center level of an eye.

In FIG. 13A and FIG. 13B, an opening (2T EYE) of the eye of 2T is apparently small, and thus the S/N is deteriorated. In FIG. 13C, since the opening (2T EYE) is not small, there is substantially no deterioration in the S/N. As apparent from the foregoing description, the asymmetry appearing in the phase-change disk and the magneto-optical disk is caused by the excessive/short power of the recording laser.

Next, the effectiveness of the Viterbi decoding apparatus according to the present invention with respect to the asymmetry will now be explained. It should be understood that considering to such a fact that the asymmetry shown in FIG. 13 is compressed/expanded along the width direction in such a manner that this asymmetry is compressed at the upper limit and the lower limit of the dynamic range, and is also expanded near the center of this dynamic range, the amplitude is mapped to an inverse tangent function (a tan).

Figure 14:
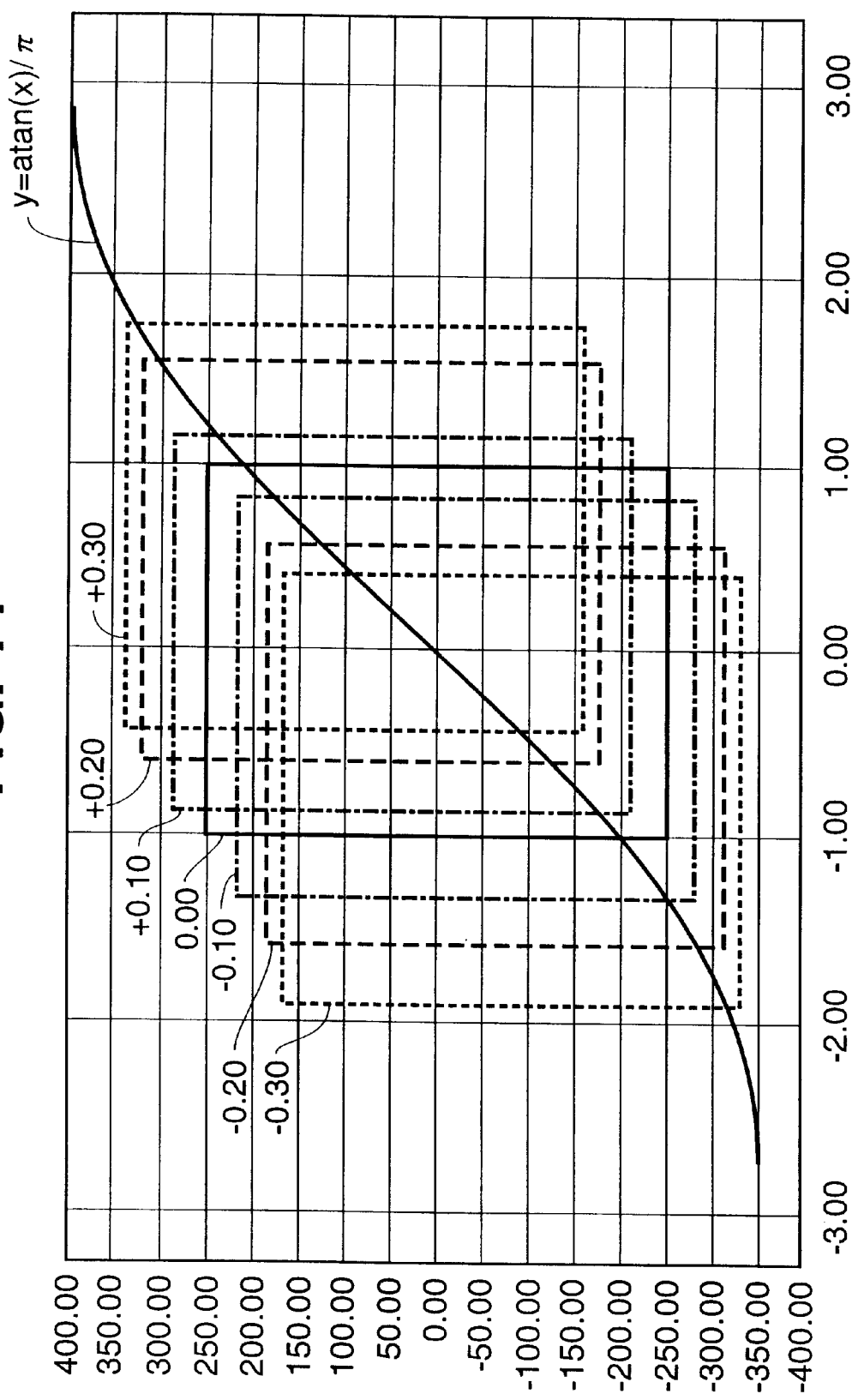
FIG. 14 graphically indicates a calculation result of a function: $y=a \tan (x)/\pi$.

FIG. 14 graphically indicates a calculation result of a function such that $y=a\tan(x)/\pi$. An abscissa of FIG. 14 indicates $x=\tan(y\cdot\pi)$, and an ordinate of FIG. 14 denotes $y=a\tan(x)/\pi \times 10^{-3}$. A center value (x cent) of x is applied, and the mapping operation is performed in a range between y min=y cent−π/4 and y max=y cent+π/4 around y cent=a tan(x cent)/π, so that the asymmetry is established. Furthermore, when x cent=0, x min=−1 and x max=±1. In this case, while the mapping result is previously obtained when x cent=0 in order to establish 1-to-1 correspondence, this mapping result is inverse-converted to thereby map an arbitrary y cent.

Figure 15:
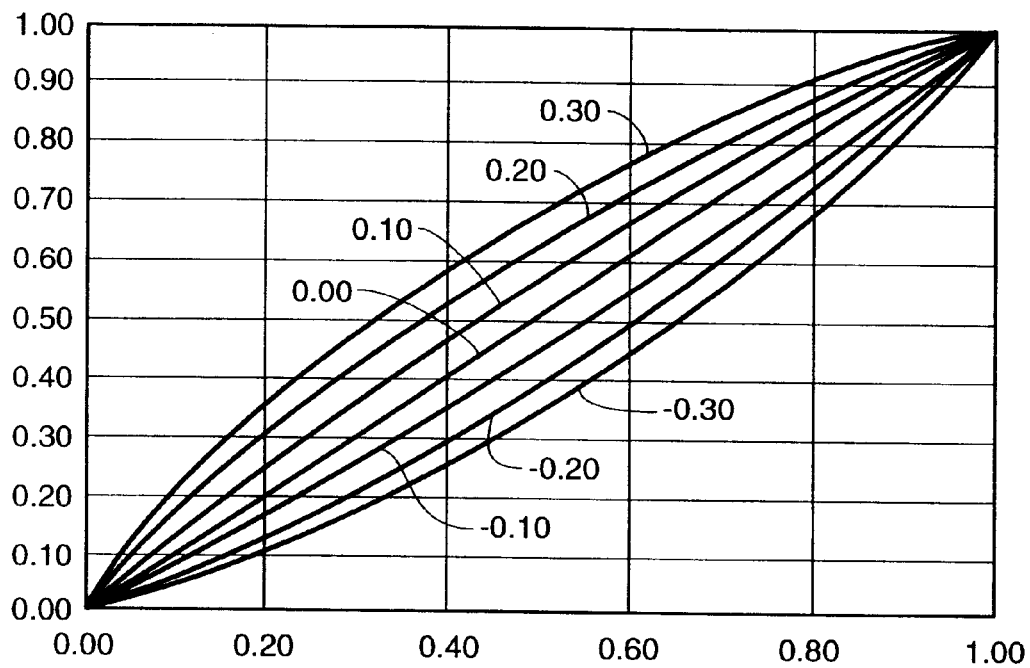
FIG. 15 graphically shows an expansion function in the case that x cent=$-0.3$ to $+0.3$ in 1-stepwise change.

FIG. 15 graphically shows an expansion function when the function is varied by a stepwise of 0.15 up to x cent=−0.3 to +0.3. An abscissa of FIG. 15 indicates an input, and an ordinate of FIG. 15 denotes an output.

Figure 16:
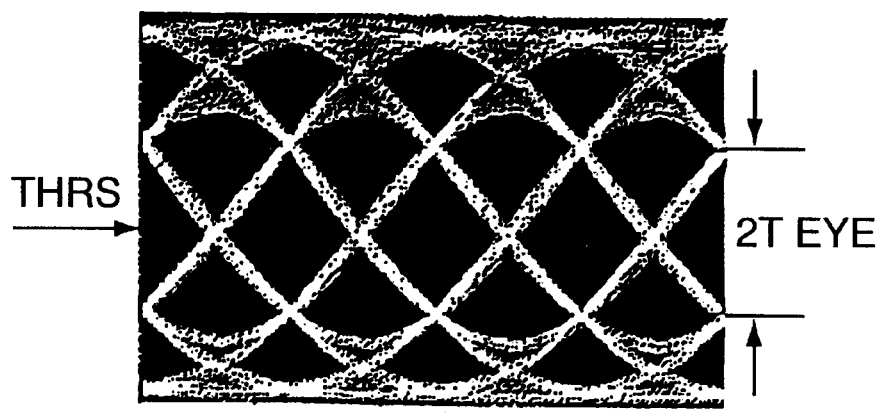
FIG. 16 is a diagram for indicating that asymmetry is applied to a reproduction signal equalized to PR (0.5, 1, 0.5)

FIG. 16 illustrates a result obtained when the asymmetry is added to the reproduction signal equalized to PR (0.5, 1, 0.5). This drawing indicate a noise-free eye pattern. As can be seen from this drawing, the asymmetry can be obtained.

Next, an explanation will now be made of a simulation result of the Viterbi decoding apparatus with respect to asymmetry. Mainly, noise components of an optical disk are added during recording operation of laser noise, and during reproducing operation of disk noise and amplifier noise. Actually, since the noise produced during the reproducing operation is major, the simulation is performed in such a manner that after the asymmetry is established, the noise is added and then the quantization is carried out for discrimination. Also, assuming now that the threshold value level THRS can be correctly traced around an eye of 2T as a center, reference amplitude levels of vd34 (3-value/4-state Viterbi decoding) and vd44 (4-value/4-state Viterbi decoding) are given as a table 3 based on this threshold value level THRS:

TABLE 3

| vd44 | c000 = THRS − 16 |
| | c001 = c100 = THRS − 8 |
| | c011 = c110 = THRS + 8 |
| | c111 = THRS + 16 |
| vd34 | c000 = c001 = THRS − 16 |
| | c100 = c011 = THRS |
| | c110 = c111 = THRS + 16 |

Figure 17:
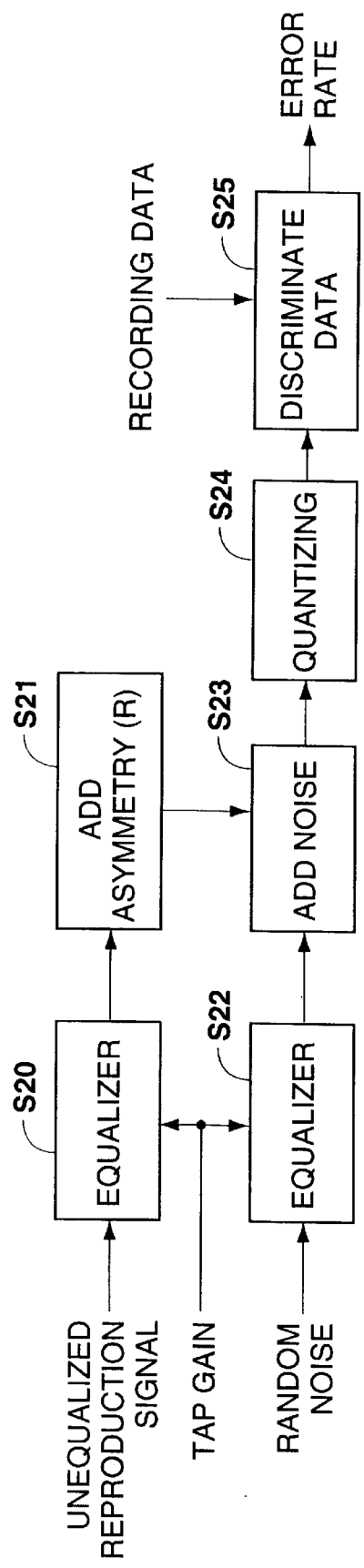
FIG. 17 is a schematic diagram for representing a simulation process operation with respect to asymmetry.

FIG. 17 represents a simulation process operation with respect to asymmetry.

[S20] An unequalized reproduction signal to which random noise has not yet been added is waveform-equalized.

[S21] Asymmetry is added to the waveform-equalized reproduction signal.

[S22] The random noise is waveform-equalized.

[S23] The random noise is added to the reproduction signal to which the asymmetry is added.

[S24] The equalized reproduction signal is quantized by 6 bits to thereby produce such reproduction signals A/D-converted into 0 to 63.

[S25] Based upon the recording data, decoded data is obtained from the reproduction signal, and then an error rate is outputted.

Figure 18:
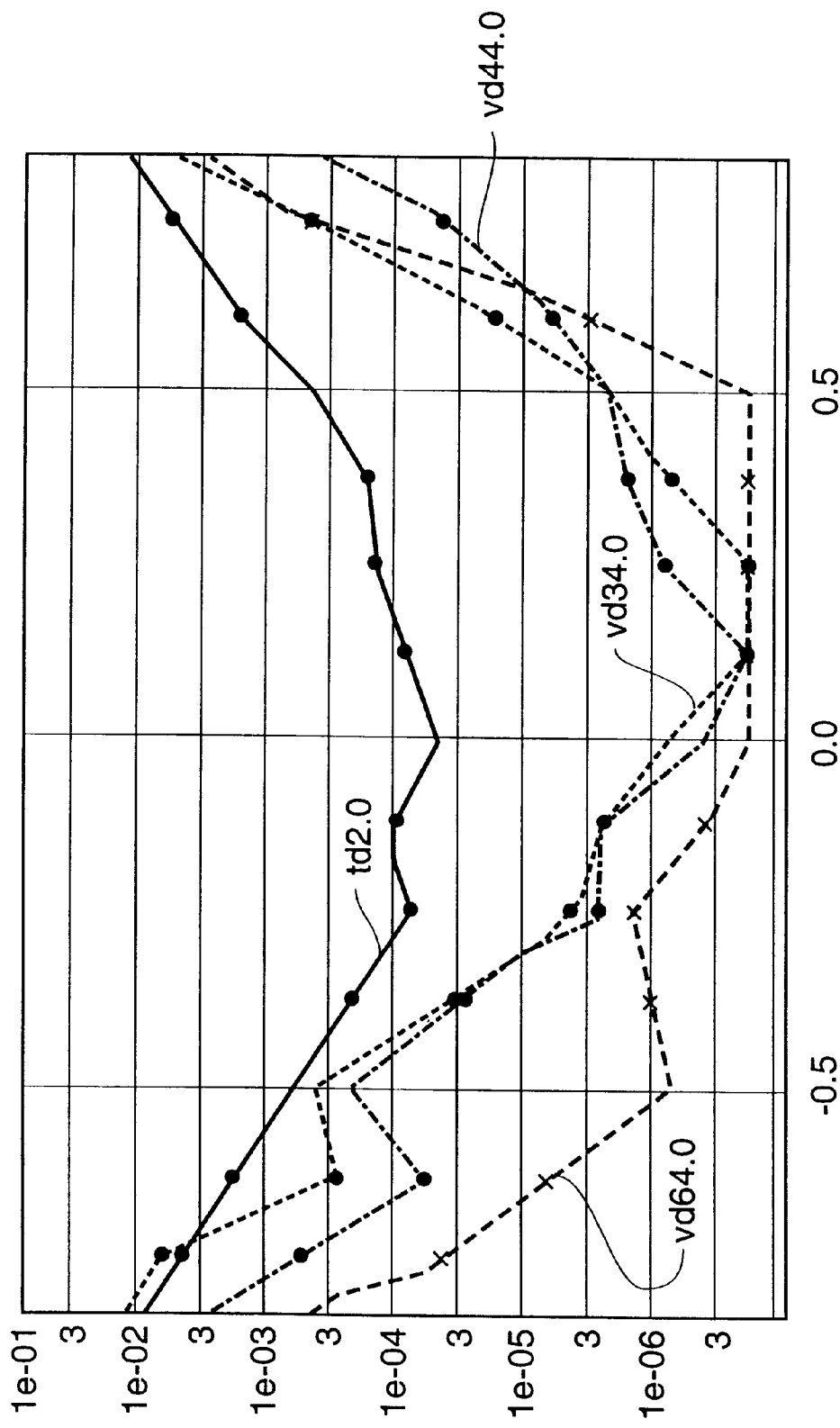
FIG. 18 graphically indicates a bit error rate when asymmetry is present.

Subsequently, a relationship between asymmetry and an error rate will now be described. FIG. 18 graphically represents a bit error rate in the case that asymmetry is present. An abscissa of FIG. 18 shows an asymmetry index, and an ordinate of FIG. 18 denotes a bit error rate. FIG. 18 represents results of 4 sorts of simulation related to the asymmetry in such a case that the index x cent of the asymmetry is varied by a stepwise of 0.125 in a range between −0.875 and +0.875.

The discrimination point phases are set in order to become optimum by detecting these discrimination-point phases in such a way that as to td2 (2-value threshold value description), vd44 (4-value/4-state Viterbi decoding), and vd64 (6-value/4-state Viterbi decoding), whereas as to vd34 (3-value/4-state Viterbi decoding), t=0.5T0. Assuming now that if the bit error rate is smaller than, or equal to 1E-04, then the error correction can be made, when an investigation is made of a range of allowable discrimination-point phases from the drawing, this range is given in a table 4:

TABLE 4

| | Range of 1E–04 |
|---|---|
| td2 | — |
| vd34 | −0.375T0 to +0.625T0 |
| vd44 | −0.375T0 to +0.625T0 |
| vd64 | −0.750T0 to +0.625T0 |

As a consequence, when a center of an eye is moved downward, the allowable range of the asymmetry is largely extended, which may indicate the great effect capable of compensating for a shortage of the recording laser power. This may achieve very large merits in view of laser lifetime. As a result, in accordance with the Viterbi decoding apparatus of the present invention, it is also possible to achieve the better error rate with respect to the above-explained asymmetry.

As previously described in detail, the Viterbi decoding apparatus of the present invention is arranged in such a manner that the selection information for selecting the minimum path metric is formed, and the discrimination results for constituting the history of the path metric are outputted based on this selection information. As a consequence, it is possible to prevent the shift occurred between the reproduction signal and the reference amplitude level, and also to obtain the error rate under better condition.

What is claimed is:

1. A Viterbi decoding apparatus comprising:

reference amplitude level saving means for saving 6 values of reference amplitude levels determined by codes interference occurred by a combination of 1-bit recording data of interest, 1-bit recording data prior to said recording data of interest and 1-bit recording data subsequent to said recording data of interest;

branch metric calculating means for calculating a branch metric equal to a relative value of a Euclidean distance between an inputted reproduction signal and said reference amplitude level;

path metric producing means for producing a path metric by adding said branch metrics along paths of 4 states;

most likelihood judgement control means for producing selection information used to select a minimum path metric from a number of said branch metrics and said path metrics and for updating said path metrics based on said selection information; and discrimination result output control means for outputting a discrimination result which constitutes a history of said path metric with respect to each of said four states based on said selection information, whereby most likelihood decoding is carried out by said Viterbi decoding apparatus under 6-value/4-state.

2. A Viterbi decoding apparatus as claimed in claim 1, further comprising:

reference amplitude level updating means for sequentially updating said reference amplitude levels by a combination between said reproduction signal and said description result to thereby adaptively control said reference amplitude level.

3. A Viterbi decoding apparatus as claimed in claim 2 wherein:

said Viterbi decoding apparatus owns as an initial value, a reference amplitude level of Viterbi decoding under 4-value/4-state for setting a partial response (0.5, 1, 0.5) to an equalization characteristic.

4. A Viterbi decoding apparatus as claimed in claim 2 wherein:

said Viterbi decoding apparatus owns as an initial value, a reference amplitude level of Viterbi decoding under 3-value/4-state for setting a partial response (1, 1) to an equalization characteristic.

5. A Viterbi decoding method comprising:

a reference amplitude level saving step for saving 6 values of reference amplitude levels determined by codes interference occurred by a combination of 1-bit recording data of interest, 1-bit recording data prior to said recording data of interest, and 1-bit recording data subsequent to said recording data of interest;

a branch metric calculating step for calculating a branch metric equal to a relative value of a Euclidean distance between an inputted reproduction signal and said reference amplitude level;

a path metric producing step for producing a path metric by adding said branch metrics along paths of 4 states;

a most likelihood judgement control step for producing selection information used to select a minimum path metric from a number of said branch metrics and said path metrics and for updating said path metrics based on said selection information; and a discrimination result output control step for outputting a discrimination result which constitutes a history of said path metric with respect to each of said four states based on said selection information, whereby most likelihood decoding is carried out by said Viterbi decoding method under 6-value/4-state.

6. A Viterbi decoding method as claimed in claim 5, further comprising:

a reference amplitude level updating step for sequentially updating said reference amplitude levels by a combination between said reproduction signal and said description result to thereby adaptively control said reference amplitude level.

7. A Viterbi decoding apparatus as claimed in claim 6, further comprising:

a step for having as an initial value, a reference amplitude level of Viterbi decoding under 4-value/4-state for setting a partial response (0.5, 1, 0.5) to an equalization characteristic.

8. A Viterbi decoding apparatus as claimed in claim 6, further comprising:

a step for having as an initial value, a reference amplitude level of Viterbi decoding under 3-value/4-state for setting a partial response (1, 1) to an equalization characteristic.

* * * * *